United States Patent [19]

Lee et al.

[11] Patent Number: 5,563,801

[45] Date of Patent: Oct. 8, 1996

[54] PROCESS INDEPENDENT DESIGN FOR GATE ARRAY DEVICES

[75] Inventors: Ven L. Lee, Los Altos Hills; Hemraj K. Hingarh, Saratoga, both of Calif.

[73] Assignee: nSOFT Systems, Inc., Mountain View, Calif.

[21] Appl. No.: 132,558

[22] Filed: Oct. 6, 1993

[51] Int. Cl.$^6$ .................................... G06F 17/50
[52] U.S. Cl. .................. 364/491; 364/488; 364/489
[58] Field of Search .................... 364/488–491, 364/578; 437/44

[56] References Cited

U.S. PATENT DOCUMENTS

| | | | |
|---|---|---|---|
| 4,024,561 | 5/1977 | Ghatalia | 357/23 |
| 4,485,390 | 11/1984 | Jones et al. | 357/23 |
| 4,638,442 | 1/1987 | Bryant et al. | 364/489 |
| 4,803,636 | 2/1989 | Nishiyama et al. | 364/491 |
| 4,827,428 | 5/1989 | Dunlop et al. | 364/491 |
| 4,954,953 | 9/1990 | Bush | 364/578 |
| 5,046,017 | 9/1991 | Yuyama et al. | 364/491 |
| 5,077,676 | 12/1991 | Johnson et al. | 364/489 |
| 5,079,717 | 1/1992 | Miwa | 364/490 |
| 5,231,590 | 7/1993 | Kumar et al. | 364/491 |
| 5,235,521 | 8/1993 | Johnson et al. | 364/489 |
| 5,247,455 | 9/1993 | Yoshikawa | 364/490 |
| 5,309,371 | 5/1994 | Shikata et al. | 364/491 |
| 5,351,197 | 9/1994 | Upton et al. | 364/491 |
| 5,500,805 | 3/1996 | Lee et al. | 364/491 |

OTHER PUBLICATIONS

Liew et al., "Circuit Reliability Simulator for Interconnect, Via, and Contact Electromigration," *IEEE Transactions on Electron Devices*, vol. 39, No. 11, Nov. 1992, pp. 2472–2479.

Obermeier et al., "Combining Circuit Level Changes with Electrical Optimization," *1988 Int'l Conference on Computer–Aided Design*, pp. 218–221.

Richman et al., "A Deterministic Algorithm for Automatic CMOS Transistor Sizing," *IEEE Journal of Solid–State Circuits*, vol. 23, Iss. 2, Apr. 1988, pp. 522–526.

Hauge, IEEE Journal of Solid–State Circuits, vol. 23, Apr. 1988, entitled "Circuit Placement for Predictable Performance," pp. 88–91.

*Primary Examiner*—Kevin J. Teska
*Assistant Examiner*—Leigh Marie Garbowski
*Attorney, Agent, or Firm*—Steven F. Caserza; Flehr, Hohbach, Test, Albritton & Herbert

[57] ABSTRACT

A unique gate array cell and ASIC library development methodology is taught which require no new simulations or new place and route to port a given device design to a same generation process technologies which are available from different vendors. This methodology make use of the minimum design rules from different vendors without reroute of the physical database. This methodology equalizes the functionality and timing characteristics of the macrocell library on a plurality of alternate sources.

4 Claims, 3 Drawing Sheets

PROCESS INDEPENDENT DESIGN FOR GATE ARRAY DEVICES

TECHNICAL FIELD

This invention pertains to integrated circuits (ICs), and more particularly to application specific integrated circuits (ASICs) such as gate arrays, embedded arrays, and standard cells.

BACKGROUND

Most major segments of the integrated circuit industry have alternate sourcing. For example a purchaser can buy SRAMs, DRAMs, and microprocessors from more than one source (i.e., a company with IC fabrication facilities). Customers have always found it desirable to have alternate sourcing available for an assured supply and lower cost by virtue of the competition among the alternate sources.

In the early eighties, the leading ASIC vendors were vertically integrated, i.e. they provided the three key technologies required for successful ASICs. These key technologies are the CAD (Computer Aided Design), the ASIC technology (The ASIC products itself; the methodologies for design, simulation, and test; and guaranteeing that the silicon works to customer specifications), and the silicon fabrication facilities to manufacture the ASICs. These ASIC vendors guaranteed the ASICs would function properly and reliably only if the ASICs were produced using that vendor's CAD, ASIC Technology, and silicon fabrication facilities and process.

Thus, in this prior art system, once a customer decides on a specific ASIC vendor, the customer is locked into using and relying on that ASIC vendor. Once the ASIC goes to production the customer is dependent on that single silicon fabrication source. Any problems with this fabrication facility, process, or company will directly impact the production of the ASICs, upon which the customer's systems are based. In such a situation the customer can go to another ASIC vendor to obtain a newly designed ASIC chip to serve the same purpose, but this is costly, time consuming, and the newly designed ASIC chip may not perform the same.

In the mid 1980's CAD companies, such as Cadence, took advantage of the customer's desire for alternate sourcing by offering a set of CAD tools that offered the customers some independence from the ASIC vendors, as their CAD tools were suitable for use with any number of ASIC vendors. Customers quickly embraced this "open" CAD concept.

This open CAD concept was a step in the direction of alternate sourcing ASICs, but ASIC vendors still required the use of their specific ASIC Technology which was integrated to their silicon fabrication process. The precise timing models in the library of ASIC technology must represent the behavior of the ASIC devices when fabricated by the ASIC vendor. An ASIC vendor is only able to guarantee accurate timing in the ASICs manufactured by themselves, and cannot guarantee the ASIC will function the same if it is fabricated using another vendor's ASIC technology or fabrication process.

For many years, ASIC vendors have been porting libraries of their proprietary ASIC products to various software tools available from different CAD companies. This provides the systems designer with a wide choice in these front end tools. However, this approach does not provide the flexibility of allowing the systems designer to choose different semiconductor fabrication facilities and guarantee the same high performance, and in some cases even the same functionality, since different vendors, different fabrication processing techniques, etc. result in variations in device performance.

As in any market, customers desire an "alternate sourcing" of their ASICs. Today there is no method or system for the true alternate sourcing of ASICs. There have been attempts to provide alternate sourcing of ASICs by two ASIC vendors teaming up to second source products using as identical ASIC architecture and fabrication processes as possible. However, even in these instances Where two or more vendors are actively pursuing identical fabrication techniques in each of their fabrication facilities, fabrication processes change over time due to different product priorities, yield enhancement techniques, use of different manufacturing equipment, etc., and thus device performance variations will increase over time. None of these attempts to second source ASICs have worked well over time. So, in spite of good intentions, alternate sourcing quickly becomes incompatible.

In array based products, such as gate arrays and embedded arrays, alternate sourcing generally does not exist. The main technical reason is the large number of macrocell library elements, which could number more than 100. These are based on a fixed primitive cell with predetermined transistor widths. It is impractical for a designer to adjust the width of each transistor to compensate for performance differences of different semiconductor processes for all the macrocells in the library. This is the main technical reason that alternate sourcing in ASICs does not exist. The only possible exception is if two companies agreed on the same architecture, library, design, methodology, design tools, same place and route software and methodology, and same semiconductor process technology. Because of customer insistence, there have been such attempts at alternate sourcing. However, different companies have different priorities and the semiconductor process technology tends to quickly drift apart and the alternate sourcing begins to fail.

At present, when a second source is needed, systems companies have no choice but to do an almost total redesign of the ASIC. Even then the ASIC components obtained from two separate ASIC vendors may or may not work the same on the customer's systems. The problem is that the second vendor's ASIC has a different architecture, different library elements, different timing performance, different methodology, different place and route, as well as a different fabrication process. The success rate of second sourcing leaves a lot to be desired.

In order to develop confidence that an ASIC will perform as desired or expected, the designer needs to perform accurate gate level simulation, including timing. Since each ASIC vendor has libraries with different timings and possibly different functional library elements, the systems customer now must select one ASIC vendor to which the simulation will be directed. Once the ASIC vendor selection is made, the simulation, place and route, timing adjustments for wire routing, and manufacturing will take a significant amount of time and effort. It is costly for the customer to duplicate this time and effort for an alternate source. The customer is in effect, due to time and cost constraints, locked in a sole sourced situation, meaning the customer can only buy from this one ASIC vendor.

In order for a customer to obtain a second source, the customer needs to duplicate the simulation on a different library, perform a different place and route which will provide different wire induced delays, and manufacture the gate array (generally a different architecture) on a different fabrication process. The odds are not good that the second sourced ASIC device will work the same after going through so many steps, each of them different from one another.

This situation increases the cost of the ASICs, but more importantly, a single source may not be able to meet demand. A single sourced vendor could have a yield problem resulting in an insufficient supply of ASICs, which in turn may stop production of the customer's electronic system which incorporates the ASIC. Or if the system sells much better than expected, a single source vendor most likely will not be able to increase production quickly enough to meet the customers demand for the ASICs.

FIG. 1 is a flow chart of a prior art attempt to provide alternate sourcing of a given basic circuit design from a plurality of vendors. As shown in FIG. 1, a first step 201 is to define a device specification, including the system behavior and timing desired. Step 202 is a synthesis step, during which equivalent logic is synthesized into different libraries of different alternate sources. This results in a netlist for each source's library which is simulated for timing and functionality in steps 203-1 and 203-2. The results of step 202 are suitable for application to a plurality of ASIC vendors parameters, by simulation steps 203-1 and 203-2, in order to verify by simulation of gate level implementations of the specified functionality and timing specifications the expected operation of ASIC devices produced by each vendor. These simulation steps need to be done at least once per vendor because the primitive library elements are logically different and have different speeds.

This prior art also requires a duplication in the place and route steps 204-1 and 204-2, during which devices and interconnects are defined in accordance with each vendor's parameters. Place and route must be uniquely performed for each ASIC vendor in steps 204-1 and 204-2 because this step significantly impacts timing. Most likely the two vendors use different place and route algorithms. So step 204-2 must be redone until the timing can match the timing of the first source which utilized a different place and route step 204-1. Fabrication steps 205-1 and 205-2 are then performed by each vendor, in accordance with specific layout steps performed for that vendor. Thus, it is shown in the prior art flow chart of FIG. 1 that a number of steps required in order to allow each ASIC vendor to fabricate devices which are intended to be functionally identical are not themselves identical, and due to the variations in these steps are likely to lead to supposedly functionally identical ASICs from two vendors which, unfortunately, are all too often not as functionally identical as one would need or desire. For example, simulation steps 204-1 and 204-2 are performed according to the individual vendor parameters, and place and route algorithms result in a difference in location of various devices within each ASIC and different electrical interconnect lengths as well. Thus, in addition to the fact that a number of steps must be duplicated specifically for each vendor, the net result is a set of devices available from a plurality of vendors which all too often have significant disparities in operating characteristics.

SUMMARY OF THE INVENTION

There is an industry wide need for "Alternate Sourceable" array based ASICs. A unique gate array cell and ASIC library development methodology is taught which require no new simulations or new place and route to port a given device design to a same generation process technologies which are available from different vendors. This methodology make use of the minimum design rules from different vendors without reroute of the physical database. This methodology equalizes the functionality and timing characteristics of the macrocell library on a plurality of alternate sources, without sacrificing performance or die size.

DETAILED DESCRIPTION

Figure 1:
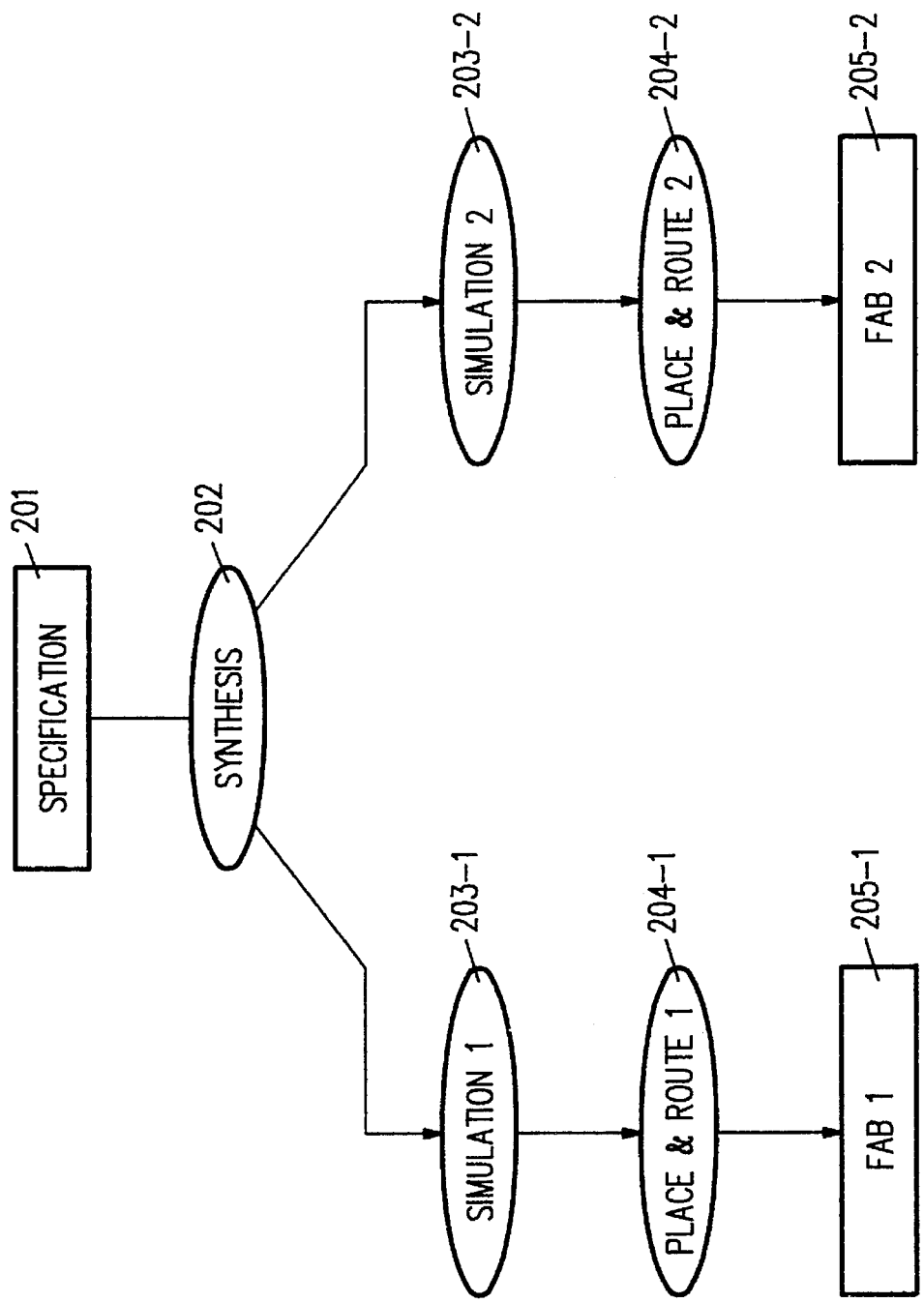
FIG. 1 is a diagram depicting how ASICs must be alternate sourced in the prior art.

In accordance with the teachings of this invention, an ASIC design is capable of being ported to a plurality of different ASIC "sources" such as different vendors or different fabrication facilities of a given vendor, using the same generation fabrication processes, even though those fabrication processes differ, and even though the simulation and place and route methods used by the sources may also differ. In accordance with the teachings of this invention, the fact that transistor characteristics are largely dependent on transistor channel width is used to advantage in order to allow an overall adjustment in channel widths to adjust for performance variations among ASICs produced by different sources. Also, as taught by this invention, for CMOS ASICs, the channel widths of N channel devices are adjusted independently of the adjustment of channel widths for P channel devices, allowing more precise matching of ASIC performance among a plurality of sources.

The performance of a transistor id dependent on the semiconductor process technology and the width, W, and length, l of a transistor channel. In general, the channel length of a transistor is kept at a minimum, since the smaller the channel length the higher the operating speed of the transistor. The transistor channel width is used to vary the switching speed of a transistor. The greater the channel width, the higher the operating speed of the transistor for any given load, but the greater the integrated circuit area required, and thus the greater the cost of the IC.

Most integrated circuits such as many RAMs, microprocessors, etc., are alternate sourced from different semiconductor companies with different fabrication process and parameters. The process technologies are generally the same generation, so that the performance difference among the different semiconductor processes are less than about 10%. Generally, a slower process technology can be made to perform just as fast as a faster process by increasing the transistor channel width, which makes the die bigger and more costly. So, there is cost associated with increasing speed. In order to alternate source an IC from another semiconductor fabrication facility, a designer can compensate for the slight speed difference caused by the different process by changing the channel widths of the transistors. Since these integrated circuits are custom designed, the designer can easily adjust the channel width of each transistor independently until the IC performs exactly like the IC from the other fabrication facility. So alternate sourcing is relatively straightforward with full custom designs, even though it might increase die area and therefore the die cost.

CMOS technology basically consists of two relatively independent processes, one to make the P channel transistors and one to make the N channel transistors. In accordance with this invention, to equalize two different processes and thus match their operating speeds, the P channel and N channel components of the fabrication process are adjusted independently. One embodiment of this invention uses a basic cell that consists of one P channel cell and one N channel cell having channel widths which are adjusted independently. So, if the P channel transistor of process A is 8% faster than an equivalent sized P channel transistor of process B then, according to this invention, the performance of processes A and B are equalized by increasing the width of the P channel transistor of process B by 8% to increase speed of the P channel transistor of process B by 8%. It is important to note that we have equalized the performance by boosting the performance of process B.

Similarly, if the N channel transistors fabricated with process A are 4% slower than the N channel transistors of process B, in accordance with this invention the channel width of N channel transistors fabricated with process A is increased by 4%, independently of the adjustment made to the P channel transistor widths, so that the N channel transistors fabricated with process A perform the same as the N channel transistors of process B. Again, the performance of the ASICs fabricated with the inherently slower fabrication process A is increased to perform like ASICs fabricated by the inherently faster fabrication process B.

It seems that it should follow that if we increase the channel width, we must be increasing the die size and therefore the component cost. However, it has been determined in accordance with this invention that this is not the case in the present invention, which allows a substantial increase in transistor channel widths without increasing the die size. Furthermore, in accordance with this invention, architecture is optimized to the minimum design rules of each fabrication process, meaning ASICs are designed to the smallest possible die size for each fabrication process. Thus the equalization of transistors, and thus ASIC devices, from a plurality of sources in accordance with this invention comes without an attendant increase in die size or cost.

Figure 2:
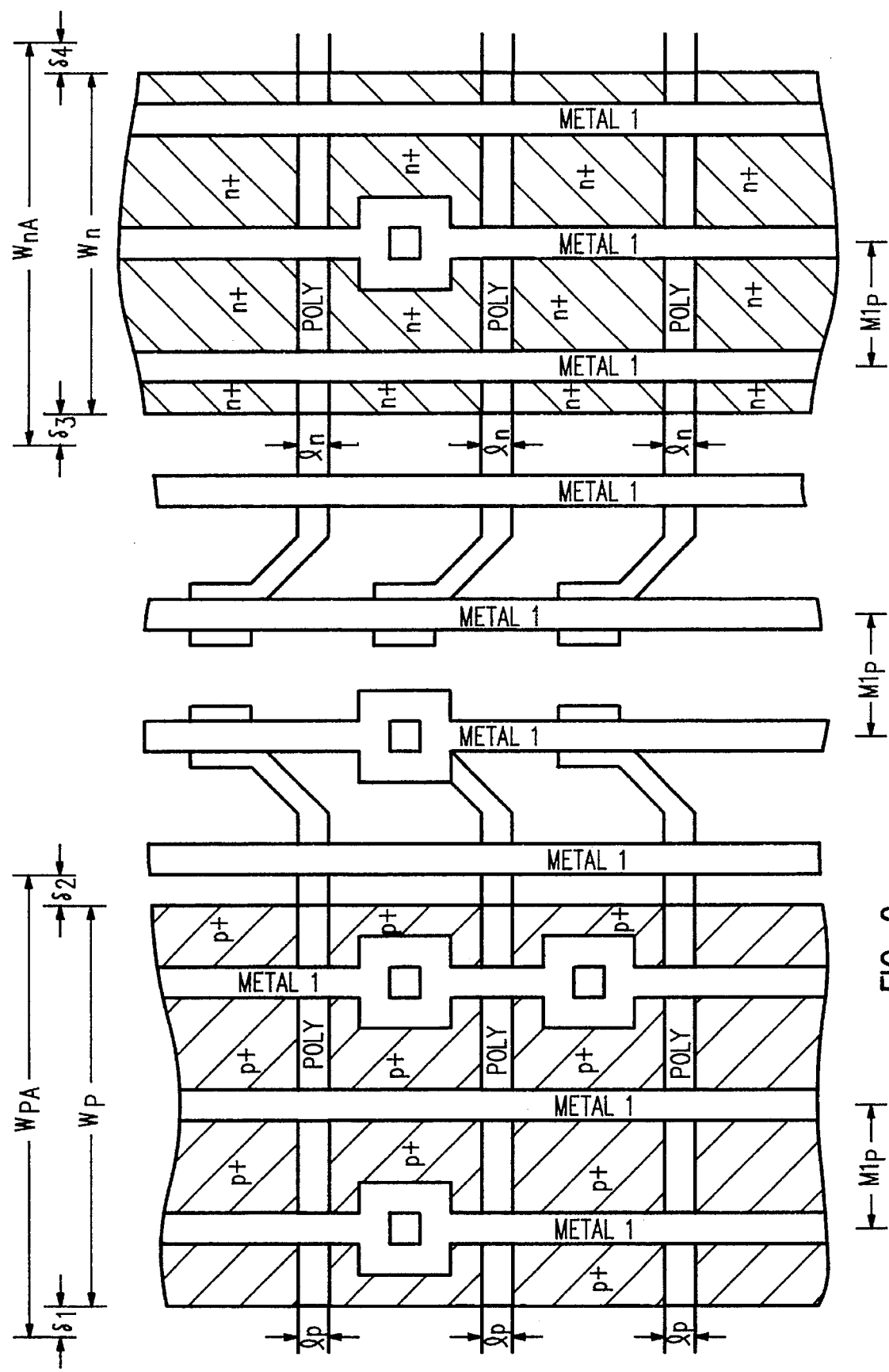
FIG. 2 is a plan view of a portion of an ASIC showing the relation of metal pitch to channel width and die size.

The reason for this ability to provide alternate sourcing of ASICs by adjusting channel widths to compensate for performance variations among a plurality of sources without an increase in die size is, as recognized by this invention, that gate arrays are unique in that their die size, in the direction of concern with respect to transistor channel widths, is determined by the metal pitch, not by the diffusion design rules such as transistor channel widths. FIG. 2 shows first metal pitch, Mlp and transistor channel widths, Wn (for N channel transistors) and Wp (for P channel transistors). Referring to FIG. 2, the P channel transistor width Wp, can be increased by $\delta 1$ and $\delta 2$ without changing the metal pitch, Mlp. Therefore, by increasing the P channel transistor channel width from Wp to WpA, in order to optimize speed in order to match the performance of another process, the die size is not increased. Then, if needed, the channel width of N transistors is independently increased from Wn up to WnA, by $\delta 3$ and $\delta 4$. Thus, the N channel transistor width is adjusted independently of the adjustment in P channel transistor width, also without an increase in die size. The equalization process consists of adjusting Wp, the P channel transistor width, until the rise times of both process A and/or B are the same. Once rise times are equalized we adjust Wn of process A and/or B to equalize the fall times of the output.

It has been determined in accordance with this invention that the metal pitch and number of desired metal interconnects allow channel widths to be subjected to approximately 15–20% increase in size, as needed, in order to provide an increase in speed to match the speed of inherently faster processes of alternate sources. From analysis of three different 0.8 um processes it has been determined that this capability to adjust device speed by increasing channel width is more than sufficient to reduce the performance differences between same generation alternate source processes to within approximately 5% or less. Thus the method of this invention allows alternate sources to use different mask sets containing the minimum design rules of each fab thereby allowing minimum die sizes, while allowing an ASIC to be optimized to increase device speed for ASICs fabricated by an inherently slower source to match the performance of alternately sourced ASICs fabricated by an inherently faster source.

Figure 3:
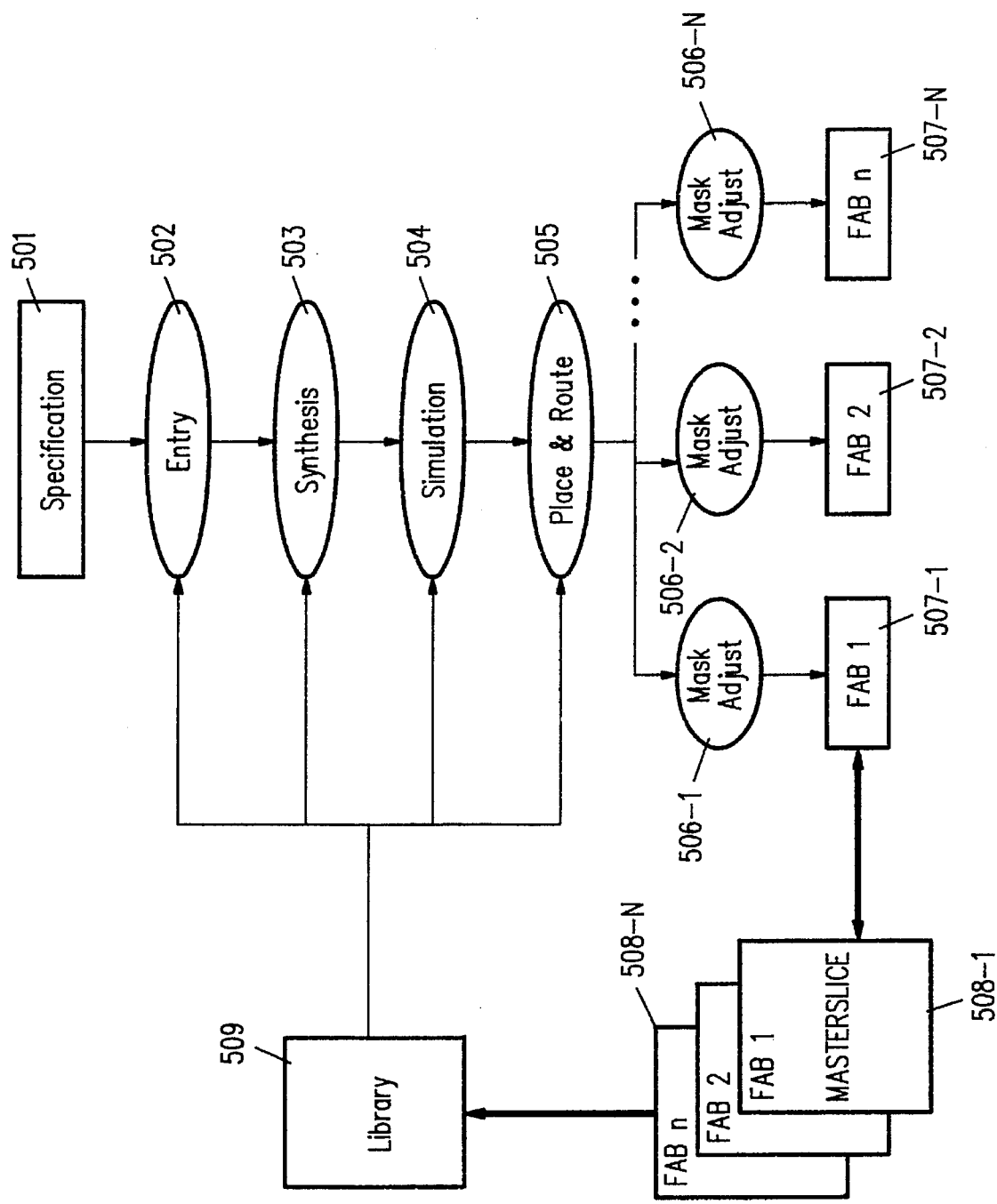
FIG. 3 is a diagram depicting how ASICs are alternate sourced in accordance with one embodiment of the present invention.

In this manner, in accordance with this invention, a single, high performance library 509 (FIG. 3) is generated and ported to different software platforms for each of the four main functions: Entry, Synthesis, Simulation, and Place and Route, as shown in FIG. 3. Library 509 includes information pertaining to the base array or "masterslice" 508-1 through 508-N of each of the alternate sources, in order to allow a given masterslice design to be adjusted based upon characteristics of each alternate source fabrication process. Once a given ASIC design is completed using library 509, a mask adjust step (506-1 through 506-N) is performed to minimize design rules of each alternate source fabrication facility. This allows for optimization to the fastest possible speed and the minimum die size capable by each alternate source fabrication facility. Thus, this invention allows a single design to be alternate sourced to a plurality of fabrication facilities without sacrificing die size.

FIG. 3 is a flow chart depicting one embodiment of a design and fabrication process in accordance with the teachings of this invention. As shown in FIG. 3, the teachings of this invention allow a given function to be implemented in a plurality of compatible base arrays available from a plurality of alternate source vendors. Referring to FIG. 3, the first step in accordance with this invention is to define the specification, (step 501) of the desired electrical function to be performed by the alternate sources. Step 502 is the entry of information from the specification, and may be performed utilizing well known commercially available entry software such as that available from Cadence, Mentor Graphics, or View Logic. Step 503 is performed after the entry step, and utilizes the information entered in entry step 502 to synthesize an electrical circuit to carry out the desired function. Synthesis step 503 may be conducted utilizing well known commercially available synthesis software such as that available from Synopsys, Cadence, or Mentor Graphics. Step 504 is a simulation step, to simulate the operating performance of the circuit synthesized in step 503. Simulation step 504 may be carried out utilizing well known and commercially available simulation software such as that available from VeriLog, Viewsim, and Quicksim. The next step is a place and route step 505 which, following simulation and any debugging in the previous steps, is performed in response to the results of simulation step 504. Place and route step 505 may be performed, for example, using well known commercially available software such as that available from Silvar Lisco or Cadence.

Following the place and route step 505, the ASIC device has been defined in a manner suitable for allowing alternately sourced ASICs to be provided by a plurality of vendors with only a minor mask adjust step (506-1 through 506-N) required in order to properly adapt the ASIC design developed utilizing steps 501 through 505 for fabrication using the specific fabrication process of a given vendor, including its specific performance parameters. Thus, for example, a first vendor who will perform fabrication step 507-1 to provide a first ASIC device meeting the requirements of the designer as specified during specification step 501, utilizes the ASIC as defined by steps 501 through 505 and applies a mask adjustment (step 506-1) to the minimum design rules of that fab, thereby adapting the ASIC design resulting from place and route step 505 to that first ASIC vendor's specific design rules and process parameters. Similar mask adjustment steps are performed for each separate ASIC vendor so that the ASIC devices provided by each vendor via its fabrication process 507-2 through 507-N are functionally and timing equivalent to each other and meet the requirements of the designer as specified during specification step 501. During these mask adjustment steps 506-1 through 506-N, the metallization, which limits the die size, is adjusted to the minimum design rules of each fab for the smallest die size that particular fab is capable of producing. Also, P and N channel transistor widths are adjusted to compensate for process differences. Since the die size is metal limited, and due to the metal pitch there is up to approximately 15–20% variation allowed in channel widths without affecting die size, we can adjust for performance by approximately 15–20% without an increase in die size.

FIG. 3 shows that, in accordance with this invention, the process parameters (such as may be defined by Spice parameters and design rules) for each alternate source fabrication facilities, equalize the performance of devices to be fabricated by each alternate source, and generate a single library with he same functionality and timing performance in order to generate models for steps 502 through 505 of FIG. 3. In this manner a customer with a desired function uses library 509 which is applicable to the plurality of alternate source fabrication facilities. Further, by using the same place and route step 505, correspondingly similar wire lengths are assured among the corresponding ASICs fabricated by alternate sources. During the mask making process, masks are adjusted (in mask adjust steps 506-1 through 506-N) to the minimum design rules for each alternate source, allowing each alternate source to produce the smallest (and thus least costly) integrated circuit permitted under its design rules.

The teachings of this invention are equally applicable to standard cell devices since the size of standard cell devices in most cases is limited in the direction of channel width Wp and Wn by the pitch of the first interconnect layer, as has been described above with respect to array devices.

The invention now being fully described, it will be apparent to one of ordinary skill in the art that many changes and modifications can be made thereto without departing from the spirit or scope of the appended claims.

What is claimed is:

1. A method of manufacturing an integrated circuit to perform a specified function, comprising the steps of:

generating information corresponding to an electronic circuit designed to perform the specified function;

determining characteristics of an integrated circuit fabricated using a first integrated circuit fabrication process, said characteristics including speed;

establishing a general pattern for an integrated circuit, within which pattern will be placed specific circuit elements;

developing a first layout for said integrated circuit, said first layout including location information for each transistor of said integrated circuit within said general pattern, wherein said developing step is performed using the information corresponding to the electronic circuit configured to perform the specified function and information corresponding to a first type integrated circuit fabrication process;

determining characteristics of an integrated circuit fabricated using a second integrated circuit fabrication process, said characteristics including speed;

determining differences in characteristics between an integrated circuit fabricated using said first fabrication process and an integrated circuit fabricated using said second fabrication process;

developing a second layout for said integrated circuit, said second layout including location information for each transistor of said integrated circuit within said general pattern, wherein said developing step is performed using the information corresponding to the electronic circuit configured to perform the specified function, information corresponding to a second type integrated circuit fabrication process, and information corresponding to said first type integrated circuit fabrication process, and including the step of adjusting channel widths of transistors in said second layout based upon said differences in characteristics between an integrated circuit fabricated using said first fabrication process and an integrated circuit fabricated using said second fabrication process.

2. A method as in claim 1 wherein said step of developing said second layout comprises the step of increasing the channel width without causing said channel to be enlarged to a width greater than a distance permitted based upon the location of electrical interconnects extending above said channel.

3. A method as in claim 1 wherein said integrated circuits comprise N channel transistors and P channel transistors, and said step of developing said second layout comprises the step of adjusting P channel transistor widths and the separate step of adjusting N channel transistor widths.

4. A method as in claim 1 which further comprises the step of fabricating integrated circuits by using said first layout with said first integrated circuit fabrication process and by using said second layout with said second integrated circuit fabrication process.

\* \* \* \* \*